United States Patent [19]

Shiobara et al.

[11] Patent Number: 5,340,851
[45] Date of Patent: Aug. 23, 1994

[54] THERMOSETTING RESIN COMPOSITIONS

[75] Inventors: Toshio Shiobara; Hisashi Shimizu, both of Annaka; Minoru Takei, Gunma, all of Japan

[73] Assignee: Shin-Etsu Chemical Company, Ltd., Tokyo, Japan

[21] Appl. No.: 17,290

[22] Filed: Feb. 12, 1993

[30] Foreign Application Priority Data

Feb. 13, 1992 [JP] Japan .................... 4-59309

[51] Int. Cl.$^5$ ............... C08G 59/40; C08L 63/00
[52] U.S. Cl. .................. 523/443; 523/466; 525/476; 525/481; 525/484; 525/487; 525/502; 525/534; 528/97
[58] Field of Search .......... 525/502, 476, 481, 484, 525/487, 534; 528/97; 523/443, 466

[56] References Cited

U.S. PATENT DOCUMENTS

| | | | |
|---|---|---|---|
| 3,329,737 | 7/1967 | Smith | 525/490 |
| 4,127,615 | 11/1978 | Zahir et al. | 525/530 |
| 4,130,600 | 12/1978 | Zahir et al. | 525/530 |
| 4,632,966 | 12/1986 | Kanagawa et al. | 525/502 |
| 4,755,569 | 7/1988 | Kanagawa et al. | 525/502 |
| 4,902,778 | 2/1990 | Boyd | 525/421 |
| 5,087,766 | 2/1992 | Kanayama | 568/718 |

FOREIGN PATENT DOCUMENTS

| | | |
|---|---|---|
| 0265374 | 9/1987 | European Pat. Off. . |
| 0439171 | 7/1991 | European Pat. Off. . |
| 0507603 | 10/1992 | European Pat. Off. . |
| 4028845 | 3/1991 | Fed. Rep. of Germany . |

*Primary Examiner*—Frederick Krass
*Attorney, Agent, or Firm*—Birch, Stewart, Kolasch & Birch

[57] ABSTRACT

A thermosetting resin composition contains (A) a mixture of an imide compound having an allyl-free maleimide group and an imide compound having an allyl-containing imide group, (B) an epoxy resin, (C) a phenolic resin, and optionally, (D) an aromatic polymer/organo-polysiloxane copolymer. Component (B) and/or (C) includes a compound containing a naphthalene ring having a double bond conjugated with an aromatic ring. The composition is easily workable and well adhesive and cures to products having improved mechanical strength, hot-water resistance, low thermal expansion, and minimized water absorption.

27 Claims, 1 Drawing Sheet

THERMOSETTING RESIN COMPOSITIONS

BACKGROUND OF THE INVENTION

1. Field of the Invention

This invention relates to a thermosetting resin composition which is easy to process and provides cured products having improved heat resistance, thus meeting the advanced material requirements.

2. Prior Art

Thermosetting resin compositions are used as electrically insulating materials, structural materials, adhesives and the like by casting, impregnating, laminating or molding. The recent trend is toward severer requirements on materials used in these applications, and especially the heat resistance of materials is an important requirement.

Polyimide and epoxy resins form typical classes of commonly used thermosetting resin compositions. Polyimide resins have good heat resistance, but require long-term, high-temperature heating to process, that is, having a processing disadvantage. Epoxy resins which are modified to improve heat resistance are easier to process, but poor in mechanical and electrical properties at high temperatures, long-term thermal deterioration resistance, and high-grade heat resistance.

There are known some substitutes for the polyimide and epoxy resins, including a thermosetting resin mixture comprising a polyimide and an alkenylphenol or alkenylphenol ether (Japanese Patent Application Kokai=JP-A No. 994/1977 or U.S. Pat. No. 4,100,140) and a thermosetting resin composition comprising a maleimide compound, a polyallylated phenol and an epoxy resin (JP-B 28416/1982 or U.S. Pat. No. 4,127,615). The polyallylated phenol used in the latter composition is obtained by Claisen rearrangement of a polyallyl ether or has the structure that generates a phenolic hydroxyl group through Claisen Rearrangement upon heat curing. Each substituting allyl group and the hydroxyl or ether group are at ortho positions on a common aromatic ring, and in the case of novolak type resin compositions, the polyallylated phenol tends to remain unreacted even after curing, leaving problems in as-cured properties and thermal deterioration resistance at high temperatures.

There is a need to have a thermosetting resin composition capable of meeting the advanced material requirements.

SUMMARY OF THE INVENTION

According to the present invention, there is provided a thermosetting resin composition comprising (A) a mixture of an imide compound having an allyl-free maleimide group of the general formula [I] defined below and another imide compound having an allyl-containing imide group of the general formula [I'] defined below, (B) a resin containing at least two epoxy groups in a molecule, and (C) a resin containing a phenolic hydroxyl group in a molecule, wherein at least one of components (B) and (C) contains a compound bearing a naphthalene ring having a double bond conjugated with an aromatic group.

This thermosetting resin composition is easy to work with and cures to products featuring good adhesion, mechanical strength at high temperature, resistance against hot water, low expansion and low water absorption, thus meeting the advanced material requirements.

In general, compounds having a maleimide group are fully effective for imparting heat resistance, but thermosetting resin compositions containing them are less satisfactory in long-term heat resistance, adhesion and workability. Quite unexpectedly, the inventors have found that when a mixture of an imide compound having an allyl-free maleimide group of formula [I] and another imide compound having an allyl-containing imide group of formula [I'] is used in combination with a compound bearing a naphthalene ring having a double bond conjugated with an aromatic group, the vinyl and allyl groups in the imide compounds react with the vinyl group in the compound bearing a naphthalene ring having a double bond conjugated with an aromatic group at a moderate curing rate to form a copolymer. Therefore, a thermosetting resin composition having improved properties is obtained.

In one preferred embodiment, a copolymer obtained by reacting an aromatic polymer with an organopolysiloxane of the following compositional formula [H] defined below is added to the composition.

In formula [II], $R^1$ is a hydrogen atom, an organic group containing an amino group, epoxy group, hydroxyl group or carboxyl group, or an alkoxy group, $R^2$ is a substituted or unsubstituted monovalent hydrocarbon group, a hydroxyl group, an alkoxy group or an alkenyloxy group, letters a and b are positive numbers satisfying $0.001 \leq a \leq 1$, $1 \leq b \leq 3$ and $1 \leq a+b \leq 4$, the number of silicon atoms in a molecule is an integer of 1 to 1,000, and the number of functional groups ($R^1$) directly attached to silicon atoms in a molecule is an integer of at least 1. Then there is obtained a low stressed thermosetting resin composition.

DETAILED DESCRIPTION OF THE INVENTION

Component (A) of the thermosetting resin composition according to the present invention is a mixture of an imide compound having a maleimide group free of an allyl group as represented by formula [I] and another imide compound having an imide group containing an allyl group as represented by formula [I'].

Preferred examples of the compounds having imide groups of formulae [I] and [I'] are compounds having N-substituted imide groups represented by the following formulae [III] and [III'], respectively.

In these formulae, substituted R is an aliphatic hydrocarbon group having 6 to 20 carbon atoms or an aromatic hydrocarbon group having 6 to 20 carbon atoms. Exemplary R groups are shown below.

In the last formula, $R^3$ is an alkyl group having 1 to 4 carbon atoms or a halogen atom and m is an integer of at least 1.

Examples of the compound having an N-substituted imide group include

N,N'-bismaleimides (inclusive of isomers) such as N,N'-diphenylmethanebismaleimide, N,N'-phenylenebismaleimide, N,N'-diphenyletherbismaleimide, N,N'-diphenylsulfonebismaleimide, N,N'-dicyclohexylmethanebismaleimide, N,N'-xylenebismaleimide, N,N'-tolylenebismaleimide, N,N'-xylelenebismaleimide, N,N'-diphenylcyclohexanebis-maleimide, N,N'-dichlorodiphenylbismaleimide, N,N'-diphenylmethanebismethylmaleimide, N,N'-diphenyletherbismethylmaleimide, N,N'-diphenylsulfonebismethylmaleimide, N,N'-ethylenebismaleimide, N,N'-hexamethylenebismaleimide, and N,N'-hexamethylenebismethylmaleimide;

prepolymers having a terminal N,N'-bismaleimide skeleton obtained by addition reaction between the aformentioned N,N'-bismaleimides and diamines;

and maleimide and methylmaleimide derivatives of anilineformaline condensates.

Other examples are given below. N-methyl-allylbicyclo[2.2.1]hept-5-ene-2,3-dicarboxyimide, N-allyl-allylbicyclo -[2.2.1]hept-5-ene-2,3-dicarboxyimide, N-(2-ethylhexyl) -allylbicyclo[2.2.1]hept-5-ene -2,3-dicarboxyimide, N-cyclohexylallylbicyclo[2.2.1]hept-5-ene-2,3-dicarboxyimide, N-phenyl-allylbicyclo[2.2.1]hept-5-ene-2,3-dicarboxyimide, N-benzyl-allylbicyclo[2.2.1]hept-5-ene-2,3-dicarboxyimide, N,N'-ethylene -bis(allylbicyclo[2.2.1]hept-5-ene-2,3-dicarboxyimide), N,N'-hexamethylenebis(allylbicyclo [2.2.1] hept-5-ene-2,3-dicarboxyimide), N,N'-dodecamethylene-bis(allylbicyclo [2.2.1]hept-5-ene-2,3-dicarboxyimide), bis[4-(allylbicyclo[2.2.1] -hept - 5-ene-2,3-dicarboxyimidophenyl)-methane, bis[4-(methallylbicyclo[2.2.1]hept-5-ene -2,3-dicarboxyimidophenyl)-methane, N,N'-p-phenylene-bis(allylbicyclo[2.2.1]-hept-5-ene-2,3-dicarboxyimide), bis[4-(allylbicyclo [2.2.1]hept-5-ene-2,3-dicarboxyimidophenyl)]ether, bis[4-(allylbicyclo[2.2.1]hept-5-ene-2,3-dicarboxyimidophenyl)]sulfone, N-allyl-allylmethylbicyclo [2.2.1]hept-5-ene-2,3-dicarboxyimide, N-(2-ethylhexyl)-allylmethylbicyclo [2.2.1]hept-5-ene-2,3-dicarboxyimide, N-phenyl-allylmethyl-bicyclo[2.2.1]hept-5-ene-2,3-dicarboxyimide, N,N'-hexamethylene-bis(allylmethylbicyclo[2.2.1]hept-5-ene-2,3-dicarboxyimide), bis[4-allylmethylbicyclo[2.2.1]hept-5-ene-2,3-dicarboxyimidophenyl] methane, bis[4-(methallylmethylbicyclo [2.2.1]hept-5-ene-2,3-dicarboxyimidophenyl)]sulfone, etc.

Still further examples of the imide compound include compounds of the following formulae as well as mixtures of a mono-substituted maleimide, tri-substituted maleimide or tetra-substituted maleimide and substituted bismaleimide.

Also useful are silicone-modified products of the aforementioned maleimide compounds.

In the practice of the present invention, each of the imide compounds of formulae [I] and [I'] may be used alone or in admixture of two or more. Preferred among others are mixtures of a tri-substituted maleimide and a substituted bismaleimide, especially N,N'-diphenylmethanebismaleimide and N,N'-diphenylmethane bis-(allylbicyclo [2.2.1]hept-5-ene-2,3-dicarboxyimide).

Preferably, the allyl-free imide compound of formula [I] and the allyl-containing imide compound of formula [I'] are mixed in a molar ratio [I]/[I'] of from 0.1 to 10, especially from 0.3 to 4 for providing cured products with improved processability, heat resistance and adhesion. A ratio [I]/[I'] of less than 0.1 would allow the allyl group existing in the imide compound of formula [I'] to have a greater influence, retarding reaction whereas a ratio [I]/[I'] of more than 10 would lead to much promoted reaction.

Component (B) of the composition according to the present invention is an epoxy resin having at least two epoxy groups in a molecule. Exemplary epoxy resins are glycidyl ether type epoxy resins such as bisphenol-A type epoxy resins, phenol novolak type epoxy resins and allylphenol novolak type epoxy resins, tri-phenolalkane type epoxy resins and polymers thereof, naphthalene type epoxy resins, biphenyl type epoxy resins, dicyclopentadiene type epoxy resins, phenolaralkyl type epoxy resins, glycidyl ester type epoxy resins, aliphatic epoxy resins, heterocyclic epoxy resins, halogenated epoxy resins, and epoxy resins bearing, in part or in entirety, a naphthalene ring having a double bond conjugated with a substituted or unsubstituted aromatic ring in a molecule. Preferred among others are the last-mentioned epoxy resins bearing a naphthalene ring having a double bond conjugated with an aromatic ring because they can form thermosetting resin compositions affording cured products having a low coefficient of thermal expansion and minimized moisture absorption.

Exemplary of the naphthalene ring-containing epoxy resin are the following compounds which may be used alone or in admixture of two or more.

In the foregoing formulae, G, Qr and n are as defined below.

n: 2-7

Component (C) of the composition according to the present invention is a resin containing a phenolic hydroxyl group in a molecule which serves as a curing agent. Examples include phenolic resins such as novolak type phenolic resins, resol type phenolic resins, triphenolalkane type phenolic resins, naphthol type phenolic resins and biphenyl type phenolic resins, phenol aralkyl resins, and phenolic resins bearing at least one naphthalene ring having a double bond conjugated with a substituted or unsubstituted aromatic ring in a molecule. These phenolic resins may be used alone or in admixture of two or more.

Among these phenolic resins, phenolic resins bearing a naphthalene ring having a double bond conjugated with an aromatic ring in a molecule are preferred curing agents because they can form thermosetting resin compositions affording cured products having a low coefficient of thermal expansion, a high glass transition temperature (Tg), a low modulus of elasticity at temperatures above Tg, and minimized moisture absorption.

Exemplary of the naphthalene ring-containing phenolic resin are the following compounds.

It will be understood that the epoxy or phenolic resins bearing a naphthalene ring having a double bond conjugated with an aromatic ring may be synthesized by conventional methods, for example, by allyl etherifying phenolic resins followed by Claisen rearrangement.

In the composition of the invention, the total amount of components (B) and (C) blended is preferably about 20 to 400 parts, especially about 50 to 300 parts by weight per 100 parts by weight of the imide compound mix as component (A). On this basis, less than 20 parts by weight of components (B) and (C) combined would sometimes adversely affect the workability and heat resistance whereas more than 400 parts by weight of components (B) and (C) combined would detract from the Tg and long-term heat resistance of the composition.

Desirably, the composition contains components (B) and (C) in such quantities that the ratio of the quantity of epoxy group in component (B) (a mol) to the quantity of phenolic hydroxyl group in component (C) (b mol), a/b, may range from ⅓ to 3/2. Outside the range, curing property and low stress would be somewhat lost.

The composition of the present invention is comprised of components (A), (B) and (C) all defined above wherein at least one of components (B) and (C) contains a compound bearing a naphthalene ring having a double bond conjugated with an aromatic group.

Desirably, the compound bearing a naphthalene ring having a double bond conjugated with an aromatic group is blended such that the substituted or unsubstituted naphthalene ring is at least 10 parts by weight per 100 parts by weight of components (B) and (C) combined. Less than 10 parts by weight of the naphthalene ring on this basis would be less effective for minimizing the moisture absorption, reducing the modulus of elasticity at temperatures above Tg, and improving the crack resistance of cured products. If the naphthalene ring content exceeds 80 parts by weight per 100 parts by weight of components (B) and (C) combined, then the composition would become rather difficult to disperse during its preparation and to mold.

By combining the resin having a double bond conjugated with an aromatic ring with the allyl-free maleimide compound and the allyl-containing imide compound as component (A), the present invention produces a thermosetting resin composition having good moldability and adequate curing rate. Preferably functional group ratio A'/B' is from 0.1 to 2, especially from 0.3 to 1 wherein A' is the allyl group in the imide compound as component (A) and B' is the (total) vinyl group in the compound or compounds having a double bond conjugated with an aromatic ring as components (B) and (C). If the functional group ratio A'/B' is greater than 2, that is, the proportion of the allyl group in the imide resin is higher, then more components would be left unreacted, leading to a curing problem and resulting in cured products having poor long-term heat resistance and reliability. If the functional group ratio A'/B' is less than 0.1, that is, the allyl group proportion is lower, then problems would arise in molding and mechanical strength.

For the purpose of reducing stress, it is preferred to blend (D) a copolymer obtained by reacting an aromatic polymer with an organo-polysiloxane in the composition according to the present invention.

The aromatic polymer used herein includes a variety of compounds, for example, compounds having the following structure.

In the formulae, R⁴ is a hydrogen atom or

R⁵ is independently an alkyl group having 1 to 10 carbon atoms, l is an integer of 0 to 4, and p is an integer of 0 to 2.

Other useful examples of the aromatic polymer are naphthalene resins containing an alkenyl group as shown by the following formulae.

It will be understood that the alkenyl group-containing naphthalene resins may be synthesized by conventional methods, for example, by reacting naphthalene skeleton-containing phenolic resins with allyl glycidyl ether for introducing an alkenyl group in the molecule or by partially reacting naphthalene skeleton-containing epoxy resins with 2-allylphenol or the like.

The other reactant, organopolysiloxane is represented by the following compositional formula [II]:

[II]

wherein $R^1$ is a hydrogen atom, an organic group containing an amino group, epoxy group, hydroxyl group or carboxyl group, or an alkoxy group, $R^2$ is a substituted or unsubstituted monovalent hydrocarbon group, a hydroxyl group, an alkoxy group or an alkenyloxy group, letters a and b are positive numbers satisfying $0\text{-}.001 \leq a \leq 1$, $1 \leq b \leq 3$ and $1 \leq a+b \leq 4$, the number of silicon atoms in a molecule is an integer of 1 to 1,000, and the number of functional groups ($R^1$) directly attached to silicon atoms in a molecule is an integer of at least 1.

More particularly, substituent $R^1$ is selected from a hydrogen atom; organic groups containing an amino group, epoxy group, hydroxyl group or carboxyl group such as —$C_xH_{2x}$COOH wherein x is an integer of 0 to 10; and alkoxy groups such as methoxy, ethoxy and n-propoxy groups. Substituent $R^2$ is selected from substituted or unsubstituted monovalent hydrocarbon groups having 1 to 10 carbon atoms such as methyl, ethyl, n-propyl and n-butyl groups; a hydroxyl group; alkoxy groups such as methoxy, ethoxy and n-propoxy groups; and alkenyloxy groups such as Examples of the organopolysiloxane of formula [II] are given below.

-continued

Although the molecular weight is not critical, the organopolysiloxane of formula [II] preferably has a molecular weight of about 100 to about 70,000. This molecular weight range is selected because when the aromatic polymer-organopolysiloxane copolymer is blended in the thermosetting resin composition, the copolymer is not miscible in the matrix, but forms a fine island-in-sea structure. With an organopoly-siloxane molecular weight of less than 100, the resulting copolymer would not be effective for imparting flexibility or high Tg to the thermosetting resin composition when blended therein. With an organopolysiloxane molecular weight of more than 70,000, the resulting copolymer would become incompatible with the thermosetting resin composition, resulting in cured products having the copolymer separated and poor physical properties (flexural strength).

The copolymer between the aromatic polymer and the organopolysiloxane of formula [II] may be prepared by effecting addition reaction between them according to conventional methods. Addition reaction between the aromatic polymer and the organopolysiloxane of formula [II] is preferably effected in an inert solvent such as benzene, toluene, and methyl isobutyl ketone using a catalytic amount of any desired one of well-known addition catalysts, for example, platinum catalysts, typically chloroplatinic acid. The reaction temperature is not critical although a temperature of about 60° to 120° C. is preferred. Usually, reaction continues for about 30 minutes to about 24 hours. Copolymers between an aromatic polymer and an aminopoly-siloxane or epoxypolysiloxane may be obtained by reacting the reactants at room temperature or elevated temperature. A suitable solvent such as methyl isobutyl ketone, toluene, dioxane and methyl cellosolve is desirably used in order to mix the reactants uniformly or nearly uniformly. For promoting the reaction, water, alcohols such as butanol, isopropyl alcohol and ethanol, and phenols may be used. It is also desirable to use reaction catalysts, for example, amines such as tributyl amine and 1,8-diazabicycloundecene-7, organic phosphines such as triphenylphosphine, and imidazoles such as 2-phenylimidazole.

In order to complete the crosslinkage between the imide compounds having maleimide groups of formulae [I] and [I'] and the resin having a double bond conjugated with an aromatic group, a curing catalyst is preferably blended in the composition of the invention. Useful curing catalysts are organic peroxides including benzoyl peroxide, parachlorobenzoyl peroxide, 2,4-dichlorobenzoyl peroxide, capryl peroxide, lauroyl peroxide, acetyl peroxide, methyl ethyl ketone peroxide, cyclohexanone peroxide, bis(1-hydroxycyclohexyl peroxide), hydroxyheptyl peroxide, tert-butylhydroperoxide, p-methane hydroperoxide, cumene hydroperoxide, di-tert-butyl peroxide, dicumyl peroxide, 2,5-dimethyl-2,5-di(tert-butyl peroxide)hexane, 2,5-dimethyl-hexyl-2,5-di(peroxybenzoate), tert-butyl perbenzoate, tert-butyl peracetate, tert-butyl peroctoate, tert-butyl peroxyiso-butyrate, and di-tert-butyl diperphthalate alone and mixtures thereof.

Further, it is preferred to use various curing promoters for the purpose of promoting the reaction between the curing catalyst and the resins. Useful curing promoters include organic phosphines, for example, triphenyl phosphine, tricyclohexyl phosphine, tributyl phosphine, methyl diphenyl phosphine, 1,2-bis(diphenyl-phosphino)ethane, and bis(diphenylphosphino)-methane; tertiary amines, for example, 1,8-diazabicyclo [5.4.0]undecene-7; and imidazoles. They may be used alone or in admixture of two or more insofar as the objects of the invention are not impaired.

The curing catalyst and curing promoter are used in a total amount of about 0.01 to 10 parts, especially about 0.1 to 2 parts by weight per 100 parts by weight of components (A), (B), (C) and (D) combined. A catalyst and promoter amount of less than 0.01 parts would not be effective for curing promotion whereas more than 10 parts of the catalyst and promoter would cause the composition to cure too fast and adversely affect its moldability.

If desired, the composition of the invention may further contain an inorganic filler. The inorganic filler is selected from fillers commonly blended in thermosetting resin compositions, for example, silicas such as fused silica and crystalline silica, alumina, carbon black, mica, clay, kaolin, glass beads, glass fibers, aluminum nitride, silicon carbide, zinc oxide, antimony trioxide, calcium carbide, aluminum hydroxide, beryllium oxide, boron nitride, titanium oxide, and iron oxide.

These inorganic fillers may be used alone or in admixture of two or more. The filler is preferably used in an amount of about 100 to about 1,000 parts, especially about 200 to about 700 parts by weight per 100 parts by weight of the total of components (A), (B), (C) and (D) although the filler content is not particularly limited.

The composition of the invention may further contain various well-known additives if desired. Exemplary additives include thermo-plastic resins, thermoplastic elastomers, organic synthetic rubbers, silicone gel or cured silicone rubber powder; mold release agents such as waxes (e.g., carnauba wax) and fatty acids (e.g., stearic acid) and metal salts thereof; pigments such as carbon black, cobalt blue, and red iron oxide; flame retardants such as antimony oxide and halides; surface treating agents such as silanes (e.g., γ-glycidoxypropyltrimethoxysilane); coupling agents such as epoxy silanes, vinyl silanes, boron compounds and alkyl titanates; antioxidants; other additives, and mixtures thereof.

The thermosetting resin compositions of the invention may be prepared by mixing and agitating predetermined amounts of the necessary components uniformly, and milling the mixture in milling means preheated at 70° to 95° C., for example, a kneader, roll mill and extruder, followed by cooling and comminution. The order of mixing the components is not critical.

The compositions of the invention are advantageously applicable as molding materials, powder coating materials, and adhesives. The compositions are also useful in encapsulating various semiconductor devices including IC, LSI, transistors, thyristors and diodes and manufacturing printed circuit boards.

There has been described a thermosetting resin composition which is low stressed, well adhesive, and easy to process and cures into a product having mechanical strength at high temperature, hot water resistance, heat resistance, and minimal moisture absorption. The composition thus fully satisfies the requirements of advanced thermosetting resin compositions and are very useful as electrically insulating materials, structural materials, adhesives, powder coating materials, semiconductor encapsulating materials, and the like.

EXAMPLE

Examples of the present invention are given below together with Comparative Examples, by way of illustration and not by way of limitation. All parts are by weight.

Examples 1-15 & Comparative Examples 1-5

Twenty thermosetting resin compositions were prepared by uniformly melt mixing the following components in a hot two-roll mill. The components used were 40 parts of a mixture of N,N'-4,4'-diphenylmethanebismaleimide and N,N'-4,4'-diphenylmethanebisallylnadiimide, an epoxy resin and a phenolic resin both shown below and used in the amounts shown in Table 1, triphenylphosphine and dicumyl peroxide curing catalysts in the amounts shown in Table 1, 260 parts of quartz powder, 1.5 parts of γ-glycidoxypropyltrimethoxysilane, 1.5 parts of wax E, and 1.0 part of carbon black.

These compositions were examined by the following tests (A) to (G). The results are also shown in Table 1.

(A) Spiral flow

Using a mold according to the EMMI standard, measurement was made at 175° C. and 70 kg/cm².

(B) Flexural strength and Flexural modulus

Test bars of 10×4×100 mm which were molded at 180° C. and 70 kg/cm² for 2 minutes and post cured at 180° C. for 4 hours were tested at 215° C. according to JIS K6911.

(C) Coefficient of linear expansion (μ) and Glass transition temperature (Tg)

Using a dilatometer, test pieces of 4 mm in diameter and 15 nun long were examined by heating them at a rate of 5° C./min.

(D) Crack resistance upon soldering after moisture absorption

Silicon chips of 2×6×0.3 nun bonded to SO package frames of 4×12×1.8 nun and then encapsulated with the thermosetting resin compositions by molding at 175° C. for 2 minutes and post curing at 180 ° C. for 4 hours. The packages were allowed to stand in a hot humid atmosphere at 85° C. and RH 85% for 24 and 48 hours and then immersed for 10 seconds in a solder bath at 240° C. Then the packages were disintegrated to observe the occurrence of internal cracks. Reported is the number of cracked packages/the total number of packages tested.

(E) Moisture resistance

4-M DRAM chips were bonded to SOJ frames with 20 pins and then encapsulated with the thermosetting resin compositions by molding at 180° C. for 2 minutes and post curing at 180° C. for 4 hours. The packages were allowed to stand for 24 hours in a hot humid atmosphere at 121° C. and RH 100%, then dipped for 10 seconds in a solder bath at 260° C., and again allowed to stand for 300 hours in a hot humid atmosphere at 121° C. and RH 100%. Reported is the number of aluminum wire broken packages/the total number of packages tested.

(F) Water absorption

Disks of 50 mm in diameter and 3 nun thick were molded at 180° C. and 70 kg/cm² for 2 minutes and post cured at 180° C. for 4 hours. The disks were subjected to a pressure cooker test (PCT) at 121° C./100% RH for 24 hours before the water absorption (percent) was measured.

(G) Adhesion

Figure 1A:
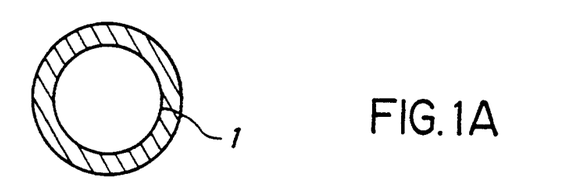
FIG. 1A is a top view of a molded part used in an adhesion test.
Figure 1B:
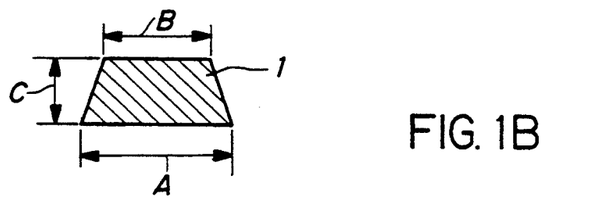
FIG. 1B is a side view of the molded part of FIG. 1A.
Figure 2:
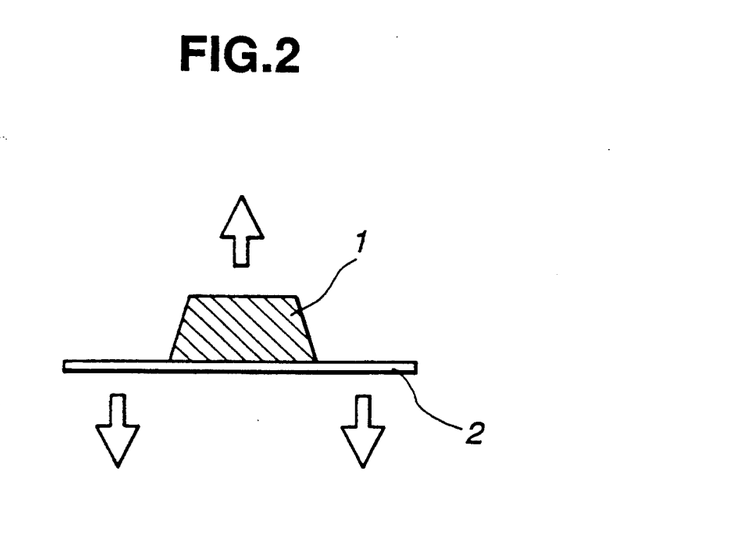
FIG. 2 is a schematic elevation showing tensile force directions in the adhesion test.

A thermosetting resin composition was formed in a frustoconical shape having dimensions A, B and C wherein A, B and C are 15 mm, 10 m m and 5 mm, respectively as shown in FIG. 1B on a 42-alloy plate of 20×20×0.5 mm by molding at 175° C. for 2 minutes and post curing at 180 ° C. for 4 hours. (FIG. 1A is a top view of the formed frustoconical shape.) Bonding force (kg) was measured by pulling apart the molded resin 1 and the plate 2 in opposite directions shown by the arrows in FIG. 2.

TABLE 1

| | Example | | | | | | | | | | | | | | | Comparative Example | | | | |
|---|---|---|---|---|---|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 15 | 1 | 2 | 3 | 4 | 5 |
| N,N'-4,4'-diphenyl-methanebismaleimide | 35 | 20 | 5 | 20 | 20 | 20 | 20 | 20 | 20 | 20 | 20 | 20 | 20 | 20 | 20 | 40 | 0 | 20 | 20 | 20 |
| N,N'-4,4'-diphenyl-methanebisallylnadiimide | 5 | 20 | 35 | 20 | 20 | 20 | 20 | 20 | 20 | 20 | 20 | 20 | 20 | 20 | 20 | 0 | 40 | 20 | 20 | 20 |
| Epoxy resin (1) | 36 | 36 | 36 | | | | | | | | | | | | | 36 | 36 | | | |
| Epoxy resin (2) | | | | 33 | | | | | | | | | | | | | | | | |
| Epoxy resin (3) | | | | | 32 | | | | | | | | | | | | | | | |
| Epoxy resin (4) | | | | | | 28 | 30 | 35 | 28 | | | | | | | | | | | |
| Epoxy resin (5) | 6.0 | 6.0 | 6.0 | 6.0 | | 6.0 | 6.0 | 6.0 | 6.0 | | 6.0 | 6.0 | 6.0 | 6.0 | | 6.0 | 6.0 | | | |
| Epoxy resin (6) | | | | | | | | | | 30 | 28 | 28 | 28 | 27 | 22 | | | 36 | 34 | 30 |
| Epoxy resin (7) | | | | | | | | | | | 10.0 | | | | 6.0 | | | 6.0 | 6.0 | 6.0 |
| Epoxy resin (8) | | | | | | | | | | | | 10.0 | | | 10.0 | | | | | |
| Epoxy resin (9) | | | | | | | | | | | | | 10.0 | | | | | | | |
| Epoxy resin (10) | | | | | | | | | | | | | | 10.0 | | | | | | |
| Phenolic resin (11) | | | | | | 26.0 | | | | 24 | | | | | 22 | | | | | 24 |
| Phenolic resin (12) | | | | | | | 24.0 | | | | | | | | | | | | | |
| Phenolic resin (13) | | | | | | | | 19 | | | | | | | | | | | | |
| Phenolic resin (14) | | | | | | | | | 26 | | | | | | | | | | | |
| Phenolic resin (15) | | | | | | | | | | | | | | | | | | | | |
| Phenolic resin (16) | 18 | 18 | 18 | 21 | 22 | | | | | | 16 | 16 | 16 | 17 | | 18 | 18 | 18 | 20 | |
| Triphenyl phosphine | 1.0 | 1.0 | 1.0 | 1.0 | 1.0 | 1.0 | 1.0 | 1.0 | 1.0 | 1.0 | 1.0 | 1.0 | 1.0 | 1.0 | 1.0 | 1.0 | 1.0 | 1.0 | 1.0 | 1.0 |
| Dicumyl peroxide | 0.4 | 0.4 | 0.4 | 0.4 | 0.4 | 0.4 | 0.4 | 0.4 | 0.4 | 0.4 | 0.4 | 0.4 | 0.4 | 0.4 | 0.4 | 0.4 | 0.4 | 0.4 | 0.4 | 0.4 |
| Sprial flow, inch | 31 | 38 | 45 | 44 | 46 | 39 | 38 | 38 | 37 | 41 | 39 | 38 | 38 | 40 | 41 | 21 | 53 | 41 | 43 | 42 |
| Flexural strength, kg/mm² | 3.5 | 3.4 | 3.4 | 3.3 | 3.4 | 3.3 | 3.5 | 3.4 | 3.5 | 3.5 | 3.0 | 3.1 | 2.9 | 3.0 | 2.9 | 3.0 | 2.5 | 3.1 | 2.0 | 3.1 |
| Flexural modulus, kg/mm² | 130 | 129 | 128 | 129 | 127 | 130 | 131 | 129 | 129 | 128 | 119 | 120 | 120 | 119 | 118 | 129 | 91 | 120 | 87 | 119 |
| Tg, °C | 220 | 221 | 224 | 221 | 225 | 230 | 227 | 226 | 225 | 228 | 220 | 221 | 221 | 220 | 220 | 221 | 182 | 221 | 186 | 221 |
| μ, 10⁻⁵/°C | 1.41 | 1.41 | 1.42 | 1.41 | 1.40 | 1.41 | 1.41 | 1.42 | 1.41 | 1.41 | 1.40 | 1.40 | 1.41 | 1.41 | 1.41 | 1.41 | 1.53 | 1.41 | 1.56 | 1.41 |
| Crack resistance 85° C./85% RH 24 hr. | 0/20 | 0/20 | 0/20 | 0/20 | 0/20 | 0/20 | 0/20 | 0/20 | 0/20 | 0/20 | 0/20 | 0/20 | 0/20 | 0/20 | 0/20 | 2/20 | 5/20 | 6/20 | 10/20 | 8/20 |
| 85° C./85% RH 48 hr. | 0/20 | 0/20 | 0/20 | 0/20 | 0/20 | 0/20 | 0/20 | 0/20 | 0/20 | 0/20 | 0/20 | 0/20 | 0/20 | 0/20 | 0/20 | 10/20 | 20/20 | 20/20 | 20/20 | 20/20 |
| Moisture resistance | 0/40 | 0/40 | 0/40 | 0/40 | 0/40 | 0/40 | 0/40 | 0/40 | 0/40 | 0/40 | 0/40 | 0/40 | 0/40 | 0/40 | 0/40 | 1/40 | 10/40 | 10/40 | 35/40 | 20/40 |
| Water absorption, % | 0.56 | 0.57 | 0.57 | 0.56 | 0.56 | 0.57 | 0.56 | 0.57 | 0.56 | 0.57 | 0.56 | 0.56 | 0.57 | 0.57 | 0.57 | 0.57 | 0.56 | 0.75 | 0.71 | 0.72 |
| Bonding force, kg | 4.2 | 4.1 | 4.5 | 4.1 | 4.2 | 4.1 | 4.2 | 4.3 | 4.4 | 4.3 | 4.2 | 4.0 | 4.1 | 4.2 | 4.1 | 0.2 | 0.1 | 0.2 | 0.3 | 0.1 |

| | Epoxy resin | Epoxy equiv. | Softening point |
|---|---|---|---|
| (1) | Naphthalene(OG)(Pr)–CH$_2$–C$_6$H$_3$(OG)(CH$_3$)–CH$_2$–Naphthalene(OG)(Pr) | 232 | 85° C. |
| (2) | Naphthalene with substituents: Pr, OG, OG, Pr (2,6-di-OG-1,5-di-Pr naphthalene) | 188 | 75° C. |
| (3) | Naphthalene(OG)–CH$_2$–C$_6$H$_3$(OG)(Pr)–CH$_2$–Naphthalene(OG) | 176 | 80° C. |
| (4) | [–C$_6$H$_2$(OG)(CH$_3$)(Pr)–CH$_2$–]$_{n'}$ | 239 | 65° C. |
| (5) | Cresol novolak type epoxy resin EOCN-1020-65 (Nippon Kayaku K.K.) | 198 | 65° C. |
| (6) | Brominated epoxy resin BREN-S (Nippon Kayaku K.K.) | 280 | 80° C. |
| (7) | Naphthalene(OG)–CH$_2$–C$_6$H$_3$(OG)(CH$_3$)–CH$_2$–Naphthalene(OG)–OCH$_2$CH(OH)CH$_2$O(CH$_2$)$_3$–Si(CH$_3$)$_2$–[OSi(CH$_3$)$_2$]$_{80}$–(CH$_2$)$_3$OCH$_2$CH(OH)CH$_2$O–Naphthalene(OG)–CH$_2$–C$_6$H$_3$(OG)(CH$_3$)–CH$_2$–Naphthalene(OG) | 1800 | 95° C. |

-continued (8)  910  85° C.

(9)  2180  94° C.

(10)  340  84° C.

G is —CH₂CH(—O—)CH₂, Pr is —CH=CH—CH₃, and n' is 2 to 7 on average.

| | Phenolic resin | OH equiv. |
|---|---|---|
| (11) |  | 169 |
| (12) |  | 149 |

-continued (13)  101

(14)  166

(15)  150

(16) Phenol novolak resin KH3488 (Dai-Nihon Ink K.K.) 110

PR is —CH=CH—CH₃, and n is 2 to 7.

As seen from Table 1, thermosetting resin compositions in which a mixture of an allyl-free maleimide compound and an allyl-containing imide compound is blended with a resin containing a naphthalene ring having a double bond conjugated with an aromatic group (Examples 1 to 15) are improved in Tg, flexural strength at high temperature, crack resistance, moisture resistance, water absorption and adhesion over thermosetting resin compositions lacking such a specific component (Comparative Examples 1 to 5).

Although some preferred embodiments have been described, many modifications and variations may be made thereto in the light of the above teachings. It is therefore to be understood that within the scope of the appended claims, the invention may be practiced otherwise than as specifically described.

We claim:

1. A thermosetting resin composition comprising
(A) a mixture of an imide compound having an allyl-free maleimide group of the general formula [I]:

[I]

and another imide compound having an allyl-containing imide group of the general formula [I']:

[I']

(B) a resin containing at least two epoxy groups in a molecule, and
(C) a phenolic resin,
wherein at least one of components (B) and
(C) contains a compound bearing a naphthalene ring having a double bond conjugated with an aromatic group.

2. The thermosetting resin composition according to claim 1 wherein the imide compounds are selected from the group consisting of N-substituted trimaleimides and N-substituted bismaleimides.

3. The thermosetting resin composition according to claim 1 wherein component (B) is an epoxy resin containing a naphthalene ring having a double bond conjugated with an aromatic ring.

4. The thermosetting resin composition according to claim 1 wherein component (C) is a phenolic resin containing a naphthalene ring having a double bond conjugated with an aromatic ring.

5. The thermosetting resin composition according to claim 1 wherein components (B) and (C) are present in a total amount of about 20 to about 400 parts by weight per 100 parts by weight of component (A).

6. The thermosetting resin composition according to claim 1 wherein components (B) and (C) contain at least about 10% by weight of naphthalene ring based on their total weight.

7. The thermosetting resin composition according to claim 2, wherein the N-substituted bismaleimide is selected from the group consisting of N,N'-diphenylmethanebismaleimide, N,N'-phenylenebismaleimide, N,N'-diphenyletherbismaleimide, N,N'-diphenylsulfonebismaleimide, N,N'-dicyclohexylmethanebismaleimide, N,N'-xylenebismaleimide, N,N'-tolylenebismaleimide, N,N'-xylelenebismaleimide, N,N'-diphenylcyclohexanebismaleimide, N,N'-dichlorodiphenylbismaleimide, N,N'-diphenylmethanebismethylmaleimide, N,N'-diphenyletherbismethylmaleimide, N,N'-diphenylsulfonebismethylmaleimide, N,N'-ethylenebismaleimide, N,N'-hexamethylenebismaleimide, and N,N'-hexamethylenebismethylmaleimide.

8. The thermosetting resin composition according to claim 1, wherein the allyl-containing imide compound of general formula (I') is selected from the group consisting of N-methyl-allylbiscyclo [2.2.1]hept-5-ene-2,3-dicarboxyimide, N-allyl-allylbicyclo[2.21]hept-5-ene-2,3-dicarboxyimide, N-(2-ethylhexyl)allylbicyclo [2.2.1]hept-5-ene-2,3-dicarboxyimide, N-cyclohexylallylbicyclo [2.2.1]hept-5-ene-2,3-dicarboxyimide, N-phenylallylbicyclo [2.2.1]hept-5-ene-2,3-dicarboxyimide, N-benzylallylbicyclo [2.2.1]hept-5-ene-2,3-dicarboxyimide, N,N'-ethylenebis (allylbicyclo[2.2.1]hept-5-ene-2,3-dicarboxyimide), N,N'-hexamethylene-bis (allylbicyclo[2.2.1]hept-5-ene-2,3-dicarboxyimide), N,N'-dodecamethylenebis (allylbicyclo[2.2.1]hept-5-ene-2,3-dicarboxyimide), bis[4-(allylbiocyclo [2.2.1]hept-5-ene-2,3-dicarboxyimididophenyl)-methane, bis[4-(methallylbicyclo[2.2.1]hept-5-ene-2,3-dicarboxyimidophenyl)-methane, N,N'-p-phenylenebis (allylbicyclo[2.2.1]hept-5-ene-2,3-dicarboxyimide), bis[4-allylbicyclo [2.2.1]hept-5-ene-2,3-dicarboxyimidophenyl)]ether, bis[4-(allylbicyclo[2.2.1]hept-5-ene-2,3-dicarboxyimidophenyl)]sulfone, N-allyl-allylmethylbicyclo[2.2.1]hept-5-ene-2,3-dicarboxyimide, N-(2-ethylhexyl)-allyl-methylbicyclo[2.2.1]hept-5-ene-2,3-dicarboxyimide, N-phenyl-allylmethylbicyclo [2.2.1]hept-5-ene-2,3-dicarboxyimide, N,N'-hexamethylenebis(allylmethyl-bicyclo [2.2.1]hept-5-ene-2,3-dicarboxyimide), bis[4-allylmethyl-bicyclo[2.2.1]hept-5-ene-2,3-dicarboxyimidophenyl] methane, and bis[4-(methallylmethylbicyclo [2.2.1]hept-5-ene-2,3-dicarboxyimidophenyl) sulfone.

9. The thermosetting resin composition according to claim 1, wherein the allyl-free maleimide compound is N,N'-diphenylmethanebismaleimide and the allyl-containing imide compound is N,N'-diphenylmethane-bis-(allylbicyclo[2.2.1]hept-5-ene-2,3-dicarboxyimide).

10. The thermosetting resin composition according to claim 1, wherein the allyl-free maleimide compound is N,N'-diphenylmethanebismaleimide and the allyl-containing imide compound is N,N'-4,4'-diphenylmethanebisallylnadiimide.

11. The thermosetting resin composition according to claim 1, wherein the molar ratio of the allyl-free imide compound of formula [I] and the allyl-containing imide compound of formula [I'] is from 0.1 and 10.

12. The thermosetting resin composition according to claim 1, wherein the molar ratio of the allyl-free imide compound of formula [I] and the allyl-containing imide compound of formula [I'] is from 0.3 to 4.

13. The thermosetting resin composition according to claim 1, wherein the resin containing at least two epoxy groups is selected from the group consisting of bisphenol-A epoxy reins, phenol novolak epoxy resins, allylphenol novolak epoxy resins, triphenolalkane epoxy resins, naphthalene epoxy resins, biphenyl epoxy resins, dicyclopentadiene epoxy resins, phenolaralkyl epoxy resins, glycidyl ester epoxy resins, aliphatic epoxy resins, heterocyclic epoxy resins, and halogenated epoxy resins.

14. The thermosetting resin composition according to claim 1, wherein the phenolic resins is selected from the group consisting of novolak phenolic resins, resol phenolic resins, triphenolalkane phenolic resins, naphthol phenolic resins, biphenyl phenolic resins, and phenol aralkyl resins.

15. The thermosetting resin composition according to claim 4, wherein the phenolic resin containing a naphthalene ring having a double bond conjugated with an aromatic ring is selected from the group consisting of and wherein n is 2 to 7 and $Q_r$ is —CH=CH—CH$_3$

16. The thermosetting resin composition according to claim 5, wherein components (B) and (C) are present in a total amount of about 50 to 300 parts by weight per 100 parts by weight of component (A).

17. The thermosetting resin composition according to claim 1, wherein the ratio of epoxy groups in component (B) to phenolic hydroxyl groups in component (C) is from 1:2 to 3:2.

18. The thermosetting resin composition according to claim 1, wherein the ratio of the allyl groups in the imide compound of component (A) to the double bonds in the compound or compounds having a double bond conjugated with a aromatic ring of components (B) and (C) is from 0.1 to 2.

19. The thermosetting resin composition according to claim 1 which further comprises (D) a copolymer obtained by reaction of a compound selected from the group consisting of -continued wherein $R^4$ is a hydrogen atom or

$R^5$ is independently an alkyl group having 1 to 10 carbon atoms, l is an integer of 0 to 4, and p is an integer of 0 to 2

, and with an organopolysiloxane of the following formula [II]:

$$R^1{}_aR^2{}_bSiO_{(4-a-b)/2} \quad [II]$$

wherein $R^1$ is a hydrogen atom, an organic group containing an amino group, epoxy group, hydroxyl group, carboxyl group, or an alkoxy group,

$R^2$ is a substituted or unsubstituted monovalent hydrocarbon group, a hydroxyl group, an alkoxy group or an alkenyloxy group, letters a and b are positive numbers satisfying $0.001 \leq a \leq 1$, $1 \leq b \leq 3$ and $1 \leq a+b \leq 4$, the number of silicon atoms in a molecule is an integer of 1 to 1,000, and the number of functional groups ($R^1$) directly attached to silicon atoms in a molecule is an integer of at least 1.

20. The thermosetting resin composition of claim 19, wherein the organopolysiloxane of formula [II] is selected from the group consisting of 21. The thermosetting resin composition according to claim 1, further comprising a curing catalyst selected from the group consisting of benzoyl peroxide, parachlorobenzoyl peroxide, 2,4-dichlorobenzoyl peroxide, capryl peroxide, lauroyl peroxide, acetyl peroxide, methyl ether ketone peroxide, cyclohexanone peroxide, bis(1-hydroxycyclohexyl)peroxide, hydroxyheptyl peroxide, tert-butylhydroperoxide, p-methane hydroperoxide, cumene hydroperoxide, di-tert-butyl peroxide, dicumyl peroxide, 2,5-dimethyl-2,5-di(tert-butyl peroxide) hexane, 2,5-dimethylhexyl-2,5-di (peroxybenzoate), tert-butyl perbenzoate, tert-butyl peracetate, tert-butyl peroctoate, tert-butyl peroxyisobutyrate, and di-tert-butyl diperphthalate alone and in mixtures thereof.

22. The thermosetting resin composition according to claim 19, further comprising a curing catalyst selected from the group consisting of benzoyl peroxide, parachlorobenzyol peroxide, 2,4-dichlorobenzoyl peroxide, capryl peroxide, lauroyl peroxide, acetyl peroxide, methyl ethyl ketone peroxide, cyclohexanone peroxide, bis(1-hydroxycyclohexyl) peroxide, hydroxyheptyl peroxide, tert-butylhydroperoxide, p-methane hydroperoxide, cumene hydroperoxide, di-tert-butyl peroxide, dicumyl peroxide, 2,5-dimethyl-2,5-di(tert-butyl peroxide)hexane, 2,5-dimethylhexyl-2,5-di (peroxybenzoate), tert-butyl perbenzoate, tert-butyl peracetate, tert-butyl peroctoate, tert-butyl peroxyisobutyrate, and di-tert-butyl diperphthalate alone and in mixtures thereof.

23. The thermosetting resin composition according to claim 21, further comprising a curing promoter selected from the group consisting of triphenyl phosphine, tricyclohexyl phosphine, tributyl phosphine, methyl diphenyl phosphine, 1,2-bis(diphenylphosphino) ethane, bis(diphenylphosphino)-methane, 1,8-diazabicyclo [5.4.0]undecene-7, and imidazoles.

24. The thermosetting resin composition according to claim 22, further comprising a curing promoter selected from the group consisting of triphenyl phosphine, tricyclohexyl phosphine, tributyl phosphine, methyl diphenyl phosphine, 1,2-bis(diphenylphosphino) ethane, bis(diphenylphosphino)-methane, 1,8-diazabicyclo[5.4.-0]undecene-7, and imidazoles.

25. The thermosetting resin composition according to claim 24, wherein the amount of curing catalyst and curing promoter is from 0.01 to 10 parts by weight of components (A), (B), (C) and (D) combined.

26. The thermosetting resin composition according to claim 24, further comprising from 100 to 1000 parts by weight of inorganic filler selected from the group consisting of fused silica, crystalline silica, alumina, carbon black, mica, clay, kaolin, glass beads, glass fibers, aluminum nitride, silicon carbide, zinc oxide, antimony trioxide, calcium carbide, aluminum hydroxide, berylium oxide, boron nitride, titanium oxide, and iron oxide per 100 parts by weight of the total of components (A), (B), (C) and (D).

27. The thermosetting resin composition according to claim 3, wherein the epoxy resin containing a naphthalene ring having a double bond conjugated with an aromatic ring is selected from the group consisting of

-continued

, and wherein G, Qr and n are n: 2-7.

* * * * *